(12) United States Patent
Kim et al.

(10) Patent No.: US 10,759,966 B1
(45) Date of Patent: Sep. 1, 2020

(54) OPTICAL LAMINATE AND FLEXIBLE DISPLAY APPARATUS COMPRISING THE SAME

(71) Applicant: LG CHEM, LTD., Seoul (KR)

(72) Inventors: Ha Neul Kim, Daejeon (KR); Eun Seon Lee, Daejeon (KR); Seungil Baek, Daejeon (KR); Woo Han Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/511,794

(22) Filed: Jul. 15, 2019

(51) Int. Cl.
- *B32B 7/02* (2019.01)
- *C09D 183/06* (2006.01)
- *H01L 27/32* (2006.01)
- *G02B 1/14* (2015.01)
- *C09D 5/00* (2006.01)

(52) U.S. Cl.
CPC ............ *C09D 183/06* (2013.01); *C09D 5/00* (2013.01); *G02B 1/14* (2015.01); *H01L 27/32* (2013.01)

(58) Field of Classification Search
CPC .. B32B 7/02; B32B 27/30; G02B 5/26; B60K 35/00
See application file for complete search history.

(56) References Cited

U.S. PATENT DOCUMENTS

| | | |
|---|---|---|
| 5,349,002 A | 9/1994 | Patel |
| 2015/0159044 A1 | 6/2015 | Bae et al. |
| 2016/0297933 A1 | 10/2016 | Kuwana et al. |
| 2018/0142128 A1 | 5/2018 | Kikuchi |

FOREIGN PATENT DOCUMENTS

| | | |
|---|---|---|
| JP | 2015-212353 A | 11/2015 |
| JP | 2017-008146 A | 1/2017 |
| JP | 2017-008148 A | 1/2017 |
| KR | 10-2015-0068240 A | 6/2015 |
| KR | 10-2016-0115612 A | 10/2016 |
| KR | 10-2017-0000065 A | 1/2017 |
| KR | 10-2018-0019115 A | 2/2018 |

*Primary Examiner* — Lawrence D Ferguson
(74) *Attorney, Agent, or Firm* — Rothwell, Figg, Ernst & Manbeck, P.C.

(57) ABSTRACT

The present disclosure relates to an optical laminate including: a supporting substrate layer; and a hard coating layer located on at least one surface of the supporting substrate layer and including a cured product of a hard coating composition, wherein the hard coating composition includes: a polysiloxane including 70 mol % or more of a structural unit containing a glycidyl group-containing functional group; an elastomer; and a reactive monomer containing at least one functional group capable of cross-linking with the polysiloxane, and the elastomer is contained in an amount of 5 to 80 parts by weight based on 100 parts by weight of the polysiloxane. The present disclosure also relates to a flexible display apparatus including the above optical laminate.

15 Claims, No Drawings

OPTICAL LAMINATE AND FLEXIBLE DISPLAY APPARATUS COMPRISING THE SAME

FIELD OF THE INVENTION

The present disclosure relates to an optical laminate and a flexible display apparatus including the same.

BACKGROUND OF THE INVENTION

Recently, with the development of mobile devices such as smart phones, tablet PCs, and the like, substrates for displays have been required to become thin and slim. Display windows or front panels of such mobile devices are generally made of glass or reinforced glass both of which have excellent mechanical properties. However, the glass and reinforced glass are heavy, which leads to a heavy mobile device and easy breakage by an external impact. Further, they are not suitable for use in flexible or foldable display devices due to their low flexibility.

As an alternative to glass, plastic resins have been researched. The plastic resin is lightweight and less likely to be broken, and has flexibility, which makes it more suitable for lightweight and flexible mobile devices. For example, polyethylene terephthalate (PET), polyethersulfone (PES), polyethylene naphthalate (PEN), polyacrylate (PAR), polycarbonate (PC), polyimide (PI), and the like are used. However, substrates using these plastic resins have a problem that hardness and scratch resistance are insufficient as compared with glass materials. Accordingly, attempts have been made to improve hardness and abrasion resistance by coating a resin composition on a plastic resin substrate to form a hard coating layer.

For example, hard coating on substrates of foldable displays mainly focuses on achieving surface hardness and scratch resistance to ensure conventional glass-like mechanical properties. However, when it is applied to a film, flexibility may be deteriorated, and thus the hard coating film may be cracked. In addition, a thin acrylic hard coating film having high hardness and flexibility has been proposed, but it has high shrinkage during curing, thereby causing severe curling and imposing limitations on impact resistance.

In addition, among the hard coating on substrates of foldable displays, an outer folding type in which the hard coating film is folded outward applies higher stress to the hard coating film as compared with an inner folding type, and thus cracks are likely to occur. As a result, conventional hard coating compositions have a limitation in providing outer folding having a low curvature of 10 mm or less in diameter.

SUMMARY OF THE INVENTION

Technical Problem

The present disclosure is to provide an optical laminate having high surface hardness and excellent mechanical properties such as scratch resistance and abrasion resistance, while exhibiting flexibility and improved resistance to cracks due to mechanical stress, and a flexible display apparatus including the same.

Technical Solution

According to an embodiment of the present disclosure, an optical laminate is provided, including:

a supporting substrate layer; and
a hard coating layer located on at least one surface of the supporting substrate layer and including a cured product of a hard coating composition,
wherein the hard coating composition includes:
a polysiloxane including 70 mol % or more of a structural unit containing a glycidyl group-containing functional group represented by the following Chemical Formula 1;
an elastomer; and
a reactive monomer containing at least one functional group capable of cross-linking with the polysiloxane, and
the elastomer is contained in an amount of 5 to 80 parts by weight based on 100 parts by weight of the polysiloxane.

[Chemical Formula 1]

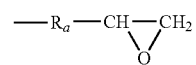

In Chemical Formula 1,
$R_a$ is selected from the group consisting of a substituted or unsubstituted C1 to C6 alkylene group, a substituted or unsubstituted C2 to C20 alkenylene group, a substituted or unsubstituted C2 to C20 alkynylene group, —$R_b$—CH=CH—COO—$R_c$—, —$R_d$—OCO—CH=CH—$R_e$—, —$R_f$O$R_g$—, —$R_h$COO$R_i$—, and —$R_j$OCO$R_k$—,
wherein $R_b$ to $R_k$ are each independently a single bond or a substituted or unsubstituted C1 to C6 alkylene group.

According to another embodiment of the present disclosure, a flexible display apparatus including the above optical laminate is provided.

Hereinafter, the optical laminate and the flexible display apparatus including the same according to the exemplary embodiments of the present disclosure will be described in more detail.

However, the following is only for better understanding of the present invention, the scope of the present invention is not limited thereby, and it is obvious to a person skilled in the related art that the embodiments can be variously modified within the scope of the present invention.

The terms are used merely to refer to specific embodiments, and are not intended to restrict the present disclosure unless it is explicitly expressed.

Singular expressions of the present disclosure may include plural expressions unless they are differently expressed contextually.

The terms "include", "comprise", and the like of the present disclosure are used to specify certain features, regions, integers, steps, operations, elements, and/or components, and these do not exclude the existence or the addition of other certain features, regions, integers, steps, operations, elements, and/or components.

In the present disclosure, the weight average molecular weight refers to a weight average molecular weight (unit: g/mol) using polystyrene calibration measured by a GPC method. In the process of measuring the weight average molecular weight using polystyrene calibration measured by a GPC method, a well-known analyzer, a detector such as a refractive index detector, and an analyzing column may be used. In addition, conventionally applied temperature conditions, solvents, and flow rates may be used. As a specific example of the measurement conditions, a temperature of 30° C., a chloroform solvent, and a flow rate of 1 mL/min may be applied.

In the present disclosure, the glycidyl group-containing functional group refers to a functional group containing a glycidyl group at the terminal.

The optical laminate according to an embodiment of the present disclosure includes:
a supporting substrate layer; and
a hard coating layer located on at least one surface of the supporting substrate layer and including a cured product of a hard coating composition,
wherein the hard coating composition includes: a polysiloxane including 70 mol % or more of a structural unit containing a glycidyl group-containing functional group represented by the following Chemical Formula 1;
an elastomer; and
a reactive monomer containing at least one functional group capable of cross-linking with the polysiloxane, and
the elastomer is contained in an amount of 5 to 80 parts by weight based on 100 parts by weight of the polysiloxane.

The hard coating layer included in the optical laminate according to an embodiment includes a polysiloxane exhibiting excellent hardness characteristics, an elastomer capable of minimizing shrinkage during curing of the polysiloxane at an optimal content, and a reactive monomer capable of improving processability and coating adhesion by lowering viscosity of the polysiloxane. Therefore, it is possible to exhibit high surface hardness and excellent mechanical properties, that is, scratch resistance and abrasion resistance, while having flexibility and improved resistance to cracks caused by mechanical stress.

Hereinafter, each component constituting the hard coating layer included in the optical laminate will be described in more detail.

(1) The Polysiloxane

The polysiloxane contained in the hard coating layer includes 70 mol % or more, 80 to 100 mol %, or 90 to 100 mol % of a structural unit containing a glycidyl group-containing functional group represented by Chemical Formula 1, thereby forming a cured product having excellent surface hardness.

Specifically, in the glycidyl group-containing functional group represented by the following Chemical Formula 1, $R_a$ may be selected from the group consisting of a substituted or unsubstituted C1 to C6 alkylene group, a substituted or unsubstituted C2 to C20 alkenylene group, a substituted or unsubstituted C2 to C20 alkynylene group, —$R_b$—CH=CH—COO—$R_c$—, —$R_d$—OCO—CH=CH—$R_e$—, —$R_f$O$R_g$—, —$R_h$COOR$_i$—, and —$R_j$OCOR$_k$—. More specifically, $R_a$ may be methylene, ethylene, propylene, allylene, —$R_b$—CH=CH—COO—$R_c$—, —$R_d$—OCO—CH=CH—$R_e$—, —$R_f$OR$_g$—, —$R_h$COOR$_i$—, or —$R_j$OCOR$_k$—. Herein, $R_b$ to $R_k$ may each independently be a single bond or a substituted or unsubstituted C1 to C6 alkylene group. More specifically, each may be a single bond, or a C1 to C6 linear alkylene group such as methylene, ethylene, propylene, butylene, and the like. More specifically, $R_a$ may be methylene, ethylene, or —$R_f$OR$_g$—, and $R_f$ and $R_g$ may be a direct bond, or a C1 to C6 linear alkylene group such as methylene, propylene, and the like.

The glycidyl group-containing functional group may preferably be a glycidyl group or a glycidoxypropyl group to improve surface hardness and curing of the cured product.

When $R_a$ is substituted, it may be substituted with at least one substituent selected from the group consisting of a C1 to C12 alkyl group, a C3 to C12 cycloalkyl group, a C2 to C12 alkenyl group, a hydroxy group, a C1 to C12 alkoxy group, an amino group, an acryl group (or an acryloyl group), a methacryl group (or a methacryloyl group), an acrylate group (or a acryloyloxy group), a methacrylate group (or a methacryloyloxy group), a halogen group, a mercapto group, an ether group, an ester group, an acetyl group, a formyl group, a carboxyl group, a nitro group, a sulfonyl group, a urethane group, an epoxy group, an oxetanyl group, and a phenyl group. More specifically, it may be substituted with at least one substituent selected from the group consisting of: a C1 to C6 alkyl group such as methyl and ethyl; an acrylic group; a methacryl group; an acrylate group; a methacrylate group; a vinyl group; an allyl group; an epoxy group; and an oxetanyl group.

Meanwhile, the structural unit containing the glycidyl group-containing functional group represented by Chemical Formula 1 may be represented by the following Chemical Formula 2.

$$(R^1SiO_{3/2})$$ [Chemical Formula 2]

In Chemical Formula 2,
$R^1$ is the glycidyl group-containing functional group represented by Chemical Formula 1.

That is, the polysiloxane may include a silsesquioxane unit of $(R^1SiO_{3/2})$ as a T3 unit.

Further, the polysiloxane may further include at least one repeating unit selected from the group consisting of repeating units represented by the following Chemical Formulae 3 to 6, in addition to the silsesquioxane unit of $(R^1SiO_{3/2})$ represented by Chemical Formula 2.

$$(R^2SiO_{3/2})$$ [Chemical Formula 3]

$$(R^3R^4SiO_{4/2})$$ [Chemical Formula 4]

$$(SiO_{4/2})$$ [Chemical Formula 5]

$$(O_{1/2}R^5)$$ [Chemical Formula 6]

In Chemical Formulae 3 to 6,
$R^2$ to $R^5$ are each independently a hydrogen atom, an epoxy group, an acryl group, a methacryl group, a halogen group, an amino group, a mercapto group, an acetyl group, a formyl group, a carboxyl group, a nitro group, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C20 aryl group, a substituted or unsubstituted C7 to C20 arylalkyl group, or a substituted or unsubstituted C7 to C20 alkylaryl group.

Specifically, the polysiloxane may further include the silsesquioxane unit of $(R^2SiO_{3/2})$ represented by Chemical Formula 3, which can increase hardening density of the polysiloxane to improve surface hardness of the hard coating layer. In addition, the polysiloxane may further include the silsesquioxane unit of $(R^3R^4SiO_{4/2})$ represented by Chemical Formula 4, which can increase flexibility while maintaining excellent hardness characteristics.

In the silsesquioxane units of $(R^2SiO_{3/2})$ and $(R^3R^4SiO_{4/2})$, the $R^2$ to $R^4$ are functional groups bonded to Si and are as defined above. More specifically, the $R^2$ to $R^4$ may each independently be selected from the group consisting of a substituted or unsubstituted C1 to C12 alkyl group, a substituted or unsubstituted C3 to C20 cycloalkyl group, a substituted or unsubstituted C6 to C12 aryl group, a substituted or unsubstituted C7 to C13 arylalkyl group, a substituted or unsubstituted C7 to C13 alkylaryl group, an epoxy group, a hydrogen atom, an amino group, a mercapto group, a carboxyl group, and a sulfone group.

In addition, the $R^2$ to $R^4$ may each independently be substituted with at least one substituent selected from the group consisting of a C1 to C12 alkyl group, a C3 to C12 cycloalkyl group, a C2 to C12 alkenyl group, a hydroxy group, a C1 to C12 alkoxy group, an amino group, an acryl group, a methacryl group, a halogen group, a mercapto group, an ether group, an ester group, an acetyl group, a formyl group, a carboxyl group, a nitro group, a sulfonyl group, a urethane group, an epoxy group, an oxetanyl group, and a phenyl group. More specifically, each may be substituted with at least one substituent selected from the group consisting of an acrylic group, a methacryl group, a vinyl group, an allyl group, an epoxy group, and an oxetanyl group.

Among them, the $R^2$ to $R^4$ may preferably be a C1 to C6 alkyl group or a C6 aryl group unsubstituted or substituted with at least one substituent selected from the group consisting of an acryl group, a methacryl group, a vinyl group, an allyl group, an epoxy group, and an oxetanyl group to further improve surface hardness of the hard coating layer by increasing hardening density of the polysiloxane.

Meanwhile, the epoxy group is a functional group containing an oxirane ring, and may include an alicyclic epoxy group, an aliphatic epoxy group, and an aromatic epoxy group.

In addition, the polysiloxane may further include a structural unit of $(SiO_{4/2})$ represented by Chemical Formula 5 and/or a structural unit of $(O_{1/2}R^5)$ represented by Chemical Formula 6, which can increase flexibility while maintaining excellent hardness characteristics.

$R^5$ may be a hydrogen atom or a C1 to C12 alkyl group, and more specifically, a hydrogen atom or a C1 to C4 linear or branched alkyl group such as a methyl group, an ethyl group, a propyl group, an isopropyl group, a butyl group, and an isobutyl group.

The polysiloxane including the above-mentioned structural units may be prepared by a hydrolysis and condensation reaction of the siloxane monomer of each structural unit. Specifically, it may be prepared by a hydrolysis and condensation reaction of alkoxysilane having a glycidyl group-containing functional group alone, or an alkoxysilane having a glycidyl group-containing functional group and another type of alkoxysilane.

Specifically, the polysiloxane may include a structural unit of $(R^1SiO_{3/2})$, a structural unit of $(R^2SiO_{3/2})$ and a structural unit of $(O_{1/2}R^5)$, so that the polysiloxane may be represented by the following Chemical Formula 8.

$(R^1SiO_{3/2})_a(R^2SiO_{3/2})_b(O_{1/2}R^5)_c$      [Chemical Formula 8]

Herein, the molar ratio of each structural unit can be controlled by controlling the alkoxysilane content. More specifically, Chemical Formula 8 may satisfy $80<a\leq 1$, $0\leq b<1$, $0\leq c<1$, and $a/(a+b)\geq 0.7$.

The polysiloxane includes the structural unit of $(R^1SiO_{3/2})$ in an amount of 70 mol % or more, more specifically 70 mol % to 100 mol %, based on 100 mol % of a total amount of T units constituting the polysiloxane (including structural units of $(R^1SiO_{3/2})$ and $(R^2SiO_{3/2})$ under the condition satisfying the content of each structural unit of $(0.75a/(a+b)\leq 1$ in molar ratio). Accordingly, hardening density of the hard coating layer is increased, and as a result, the hard coating layer can exhibit significantly improved surface hardness. When the amount of the structural unit of $(R^1SiO_{3/2})$ is less than 70 mol % based on 100 mol % of a total amount of T units in the polysiloxane, the coating film hardly exhibits sufficient surface hardness due to the decrease in hardening density. More specifically, the structural unit of $(R^1SiO_{3/2})$ may be contained in an amount of 75 to 98 mol % based on a total amount of T units, that is, 100 mol % ($0.75\leq a/(a+b)\leq 0.98$ in molar ratio).

When the polysiloxane further includes the structural unit of $(R^2SiO_{3/2})$, it is preferable to satisfy the following condition: $0<b<0.5$, or $0.01\leq b\leq 0.5$, more specifically, $0.1\leq b\leq 0.3$. When the structural unit of $(R^2SiO_{3/2})$ is contained within the above range, hardening density of the polysiloxane may be increased to improve surface hardness of the hard coating layer.

When the polysiloxane further includes the structural unit of $(O_{1/2}R^5)$, it is preferable to satisfy the following condition: $0<c<0.5$, more specifically, $0.01\leq c\leq 0.3$, or $0.01\leq c\leq 0.1$. When the structural unit of $(O_{1/2}R^5)$ is contained within the above range, a thick film having a thickness of 50 μm or more may be obtained by solving the difference in hardening according to the thickness as well as improving the surface hardness.

A total sum of the molar ratios of the structural units of $(R^1SiO_{3/2})$, $(R^2SiO_{3/2})$ and $(O_{1/2}R^5)$ included in the polysiloxane may be 1 ($a+b+c=1$), under the condition satisfying the above content.

In the present disclosure, the content of each structural unit constituting the polysiloxane may be determined by $^1$H-NMR or $^{29}$Si-NMR spectroscopy.

Specific examples of the polysiloxane include polyorganosilsesquioxane containing glycidyl epoxy, polyorganosiloxane containing glycidyl epoxy and dimethyl at the same time, and the like, and any one or a mixture thereof may be used.

In addition, the polysiloxane may have an equivalent weight of the glycidyl group-containing functional group represented by Chemical Formula 1 of 3.0 to 6.3 g/eq. When the equivalent weight of the glycidyl group-containing functional group is within the above range, dense cross-linking may be performed during polymerization to exhibit better hardness characteristics. More specifically, the polysiloxane may have an equivalent weight of the glycidyl group-containing functional group of 4 to 6 g/eq.

The equivalent weight of the glycidyl group-containing functional group of the polysiloxane is a value obtained by dividing the molecular weight of the polysiloxane by the number of the glycidyl group-containing functional group and may be analyzed by a chemical titration method or by NMR measurement.

The weight average molecular weight, molecular weight distribution, and the like of the polysiloxane can be controlled by controlling a reaction rate using a reaction temperature, an amount of catalyst, a type of solvent, and the like. The polysiloxane usable in the present disclosure may have the weight average molecular weight of 1000 to 50,000 g/mol. The polysiloxane having the weight average molecular weight within the above range may exhibit excellent hardness characteristics. When the weight average molecular weight is less than 1000 g/mol, hardness may be insufficient and ductility may be rather developed. When the weight average molecular weight is more than 50,000 g/mol, the polysiloxane may exhibit high hardness, but lowered film processability. More specifically, it may be 2000 to 30,000 g/mol, or 2500 to 10,000 g/mol.

Further, the polysiloxane may have a number average molecular weight (Mn) of 1000 to 10,000 g/mol, specifically 1200 to 5,000 g/mol, and more specifically 2000 to 3,000 g/mol in addition to the Mw. When the number average molecular weight is satisfied, compatibility with other components in the resin composition for forming a hard coating layer is increased and surface hardness of the cured product is improved, so that heat resistance and abrasion resistance of the cured product can be further improved.

The polysiloxane may have a molecular weight distribution (Mw/Mn) of 1.0 to 10.0, more specifically 1.3 to 3.0. When the molecular weight distribution is within the above range, an effect of improving surface hardness is excellent, and the polysiloxane may exist in a liquid phase, which facilitates handling The weight average molecular weight and number average molecular weight of the polysiloxane described above are calibrated values using standard polystyrene by gel permeation chromatography.

(2) The Elastomer

The elastomer included in the hard coating layer may be at least one polyol selected from the group consisting of a polyether-based polyol, a polyester-based polyol, an aliphatic hydrocarbon-based polyol, and a polycarbonate-based polyol.

Specifically, the polyester-based polyol may be a polyether-based polyol, which is represented by the following Chemical Formula 7.

[Chemical Formula 7]

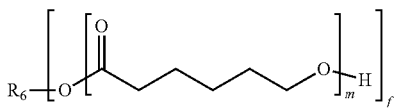

In Chemical Formula 7,
$R^6$ is a polyol-derived unit,
m is an integer of 1 or more, and
f is an integer of 2 or more.

Specifically, the polyol-derived unit $R^6$ may be a unit formed by a urethane reaction of a polyol with caprolactone or the like. That is, when a hydroxyl group of the polyol reacts with an ester group of the caprolactone, a new ester bond is formed through ring-opening of the caprolactone. Herein, $R^6$ is a moiety excluding the ester bond formed by the polyol through the ring-opening reaction, and the ester bond is represented by Chemical Formula 7.

When the polyol-derived unit $R^6$ is a unit derived from a polyol having three or more hydroxyl groups such as a triol unit, a structure in which the $R^6$ moiety is branched in the structure of the above chemical formula may be obtained.

Specifically, the kind of the polyol-derived unit $R^6$ is not particularly limited, but may be at least one selected from the group consisting of an ethylene glycol unit, a propylene glycol unit, a 1,2-butylene glycol unit, a 2,3-butylene glycol unit, a 1,3-propanediol unit, a 1,3-butanediol unit, a 1,4-butanediol unit, a 1,6-hexanediol unit, a neopentyl glycol unit, a 1,2-ethylhexyldiol unit, a 1,5-pentanediol unit, a 1,10-decanediol unit, a 1,3-cyclohexane dimethanol unit, a 1,4-cyclohexane dimethanol unit, a glycerin unit, a trimethylolpropane unit, a 2,2'-oxydimethanol unit, a 2,2'-oxydiethanol unit, a 2,2'-oxydipropanol unit, and a 2,2'-oxydibutanol unit for achieving desired physical properties.

In Chemical Formula 7, m is an integer of 1 or more, the range may be selected in consideration of desired physical properties, and may be, for example, about 1 to 10 or 1 to 5. In addition, f is an integer of 2 or more, the range may be selected in consideration of desired physical properties, and may be, for example, about 2 to 10 or 2 to 5.

The hard coating layer including the polyester-based polyol represented by Chemical Formula 7 as an elastomer increases toughness of the optical laminate including the elastomer and minimizes shrinkage during curing, thereby improving the warpage property and flexibility without deteriorating other physical properties.

The elastomer may be contained in an amount of 5 to 80 parts by weight, 10 to 75 parts by weight, or 15 to 70 parts by weight based on 100 parts by weight of the polysiloxane. When an excessive amount of the elastomer is added, the hardness characteristics may be largely lowered. When the elastomer is added in an excessively small amount, the effect from the elastomer may be insufficient, thereby lowering the warpage property and flexibility.

More specifically, the polysiloxane and the elastomer may be included in a weight ratio of 95:5 to 60:40. More specifically, they may be included in a weight ratio of 92:8 to 60:40, or 85:15 to 60:40, to improve the warpage property and flexibility.

Other elastomers such as a C1 to C20 alkane diol, a polyolefin polyol, a polyester polyol, a polycaprolactone polyol, a polyether polyol, or a polycarbonate polyol may be further included in addition to the elastomer of Chemical Formula 7. The content of the other elastomer may be suitably determined so as to not hinder the effect within the content of the above-described elastomer.

(3) The Reactive Monomer

The reactive monomer includes at least one functional group capable of cross-linking with the polysiloxane, thereby lowering viscosity of the polysiloxane to facilitate processability and improve coating adhesion.

Specifically, the reactive monomer may be a compound containing an alicyclic epoxy group, a glycidoxy group, or an oxetane group as the functional group capable of cross-linking with the polysiloxane, and any one or a mixture thereof may be used.

Examples of the compound containing an alicyclic epoxy group may include 4-vinylcyclohexene dioxide, cyclohexene vinyl monoxide, (3,4-epoxycyclohexyl)methyl 3,4-epoxycyclohexylcarboxylate, 3,4-epoxycyclohexylmethyl methacrylate, 3,4-epoxycyclohexanecarboxylate, 2-(3,4-epoxycyclohexyl)-1,3-dioxolane, bis(3,4-epoxycyclohexylmethyl)adipate, and the like, and any one or a mixture thereof may be used. Examples of the compound containing a glycidoxy group may include octylene oxide, p-butylphenol glycidyl ether, butyl glycidyl ether, cresyl glycidyl ether, styrene oxide, allyl glycidyl ether, phenyl glycidyl ether, butadiene dioxide, divinylbenzene dioxide, diglycidyl ether, butanediol diglycidyl ether, limonene dioxide, vinylcyclohexene dioxide, diethylene glycol diglycidyl ether, and the like, and any one or a mixture thereof may be used. Examples of the compound containing an oxetane group may include 3-methyloxetane, 2-methyloxetane, 3-oxethanol, 2-methylene oxetane, 3-methyl-3-hydroxymethyloxetane, 3-ethyl-3-hydroxymethyloxetane, 3,3-oxetanedimethanethiol, 2-ethylhexyloxetane, 4-(3-methyloxetane-3-yl)benzonitrile, N-(2,2-dimethylpropyl)-3-methyl-3-oxetanemethanamine, N-(1,2-dimethylbutyl)-3-methyloxetanemethanamine, xylene bisoxetane, 3-ethyl-3[{(3-ethyloxetan-3-yl)methoxy}methyl]oxetane, (3-ethyloxetan-3-yl)methyl methacrylate, 4-[(3-ethyloxetan-3-yl)methoxy]butan-1-ol, and the like, and any one or a mixture thereof may be used.

The reactive monomer may be contained in an amount of 5 to 20 parts by weight based on 100 parts by weight of the polysiloxane. When the reactive monomer is contained at less than 5 parts by weight, the effect from the reactive monomer may be insufficient. When exceeding 20 parts by weight, viscosity of the polysiloxane becomes excessively low due to the excessive reactive monomer, and thus processability may be rather lowered. In order to improve processability and coating adhesion of the hard coating composition, the reactive monomer may be contained in an amount of 7 to 20 parts by weight, more specifically 9 to 15 parts by weight, based on 100 parts by weight of the polysiloxane.

(4) Others

The hard coating composition for forming the hard coating layer may further include at least one selected from the group consisting of an initiator, a solvent, an antioxidant, a surfactant, a yellowing inhibitor, an inorganic filler, a lubricant, a coating aid, and an antifouling agent. The hard coating layer includes a cured product of the hard coating composition, and the cured product may be a photo-cured product or a thermo-cured product.

Specifically, the initiator may be a photopolymerization initiator or a thermal polymerization initiator that is well known in the art, and the kind thereof is not particularly limited. For example, the photopolymerization initiator may be at least one selected from the group consisting of arylsulfonium hexafluoroantimonate salt, arylsulfonium hexafluorophosphate salt, diphenyliodonium hexafluorophosphate salt, diphenyliodonium hexaantimonium salt, ditolyliodonium hexafluorophosphate salt, and 9-(4-hydroxyethoxyphenyl)thianthrenium hexafluorophosphate salt, but is not limited thereto. The thermal polymerization initiator may be at least one selected from the group consisting of 3-methyl-2-butenyltetramethylene sulfonium hexafluoroantimonate salt, ytterbium trifluoromethanesulfonate salt, samarium trifluoromethanesulfonate salt, erbium trifluoromethanesulfonate salt, dysprosium trifluoromethanesulfonate salt, lanthanum trifluoromethanesulfonate salt, tetrabutylphosphonium methanesulfonate salt, ethyltriphenylphosphonium bromide salt, benzyldimethylamine, dimethylaminomethylphenol, triethanolamine, N-n-butylimidazole, and 2-ethyl-4-methylimidazole, but is not limited thereto.

The initiator may be contained in an amount of 0.1 to 10 parts by weight based on 100 parts by weight of the polysiloxane. When the initiator is contained less than 0.1 parts by weight, only surface hardening occurs or epoxy hardening does not occur sufficiently, resulting in low hardness. When exceeding 10 parts by weight, cracking and peeling of the hard coating film may occur due to a rapid curing rate. More specifically, the initiator may be contained in an amount of 0.5 to 5 parts by weight, or 1 to 2 parts by weight.

The hard cording composition may be used solvent-free when there is no problem in the process. However, in order to control viscosity and flowability of the composition during coating and to improve applicability of the composition onto a supporting substrate, an organic solvent may be optionally used.

When the hard coating composition further includes an organic solvent, examples of the organic solvent may include an alcohol-based solvent such as methanol, ethanol, isopropyl alcohol, and butanol, an alkoxy alcohol-based solvent such as 2-methoxyethanol, 2-ethoxyethanol, and 1-methoxy-2-propanol, an ketone-based solvent such as acetone, methyl ethyl ketone, methyl isobutyl ketone, methyl propyl ketone, and cyclohexanone, an ether-based solvent such as propylene glycol monopropyl ether, propylene glycol monomethyl ether, ethylene glycol monoethyl ether, ethylene glycol monopropyl ether, ethylene glycol monobutyl ether, diethylene glycol monomethyl ether, diethyl glycol monoethyl ether, diethyl glycol monopropyl ether, diethyl glycol monobutyl ether, and diethylene glycol-2-ethylhexyl ether, and an aromatic solvent such as benzene, toluene, and xylene, which may be used alone or in combination.

The solvent may be added in an amount such that viscosity of the hard coating composition is 10 to 2000 cps. When the viscosity of the hard coating composition is less than 10 cps, the film may not be easily formed, and when the viscosity is more than 2000 cps, a thickness of the film may be uneven. More specifically, the solvent may be added in an amount such that viscosity of the hard coating composition is 70 to 1000 cps. The viscosity of the hard coating composition can be measured using a viscometer such as a BROOK FIELD viscometer.

The hard cording composition may further include at least one additive commonly used in the art such as an antioxidant, a surfactant, a yellowing inhibitor, an inorganic filler, a lubricant, a coating aid, or an antifouling agent. The content thereof may vary within a range that does not deteriorate physical properties of the hard coating film of the present disclosure, and thus it is not particularly limited. For example, it may be 0.1 to 10 parts by weight based on 100 parts by weight of the polysiloxane.

For example, the antioxidant is for reducing an oxidation reaction caused by the polymerization initiator. The antioxidant may be at least one selected from the group consisting of phenolic-based, phosphate-based, amine-based, and thio-ester-based antioxidants, but is not limited thereto. As the surfactant, a fluorine-based acrylate, a fluorine-based surfactant, or a silicone-based surfactant having 1 to 2 functionalities may be used. The surfactant may be dispersed or cross-linked in the cross-linked copolymer. As the yellowing inhibitor, a benzophenone-based compound or a benzotriazole-based compound may be used.

(5) The Supporting Substrate Layer

The optical laminate includes a supporting substrate layer for supporting the hard coating layer. The hard coating layer may be located on one surface of the supporting substrate layer or on both surfaces of the supporting substrate layer.

The supporting substrate layer may include a transparent plastic resin. Examples of the plastic resin include at least one resin selected from the group consisting of a polyester-based resin, a cellulose-based resin, a polycarbonate-based resin, an acryl-based resin, a styrene-based resin, a polyolefin-based resin, a polyimide-based resin, a polyamideimide-based resin, a polyethersulfone-based resin, and a sulfone-based resin.

More specifically, the supporting substrate layer may include at least one selected from the group consisting of polyethylene terephthalate (PET), a cyclic olefin copolymer (COC), polyacrylate (PAC), polycarbonate (PC), polyethylene (PE), poly(methylmethacrylate) (PMMA), polyether ether ketone (PEEK), polyethylene naphthalate (PEN), polyetherimide (PEI), polyimide (PI), polyamideimide (PAI) and triacetylcellulose (TAC).

In addition, the supporting substrate layer may be a single layer, or may have a multilayer structure of two or more layers made of the same or different materials. For example, the supporting substrate layer may have a multilayer structure of polyethylene terephthalate (PET), a multilayer structure formed by coextrusion of poly(methylmethacrylate) (PMMA)/polycarbonate (PC), or a single layer structure including a copolymer of poly(methylmethacrylate) (PMMA) and polycarbonate (PC).

Further, the supporting substrate layer may be subjected to a plasma surface treatment, if necessary. The method thereof is not particularly limited, and may be carried out according to a conventional method.

In addition, the supporting substrate layer may have a thickness of 30 to 1200 μm, or 50 to 800 μm.

The optical laminate can be prepared according to a conventional preparation method of a film except that the hard coating composition described above is used.

Specifically, the optical laminate may be prepared by a method including a step of applying the hard coating composition described above onto at least one surface of the supporting substrate layer and then curing it. The hard coating composition may be applied by a known method such as with die coater, an air knife, a reverse roll, a spray, a blade, casting, gravure coating, spin coating, and the like.

Thick hard coating layers generally have excellent strength, but they are fragile when folded if they are too thick. When the thickness is too thin, strength may be poor even if the folding property is excellent. However, the hard coating layer included in the optical laminate according to an embodiment has no chance of cracking even when the thickness of the film is increased due to the optimal composition. Accordingly, the hard coating layer can have a thickness of 50 to 250 μm. When the thickness of the film is less than 50 μm, strength characteristics may be deteriorated. When the thickness exceeds 250 μm, flexibility may be deteriorated. More specifically, the thickness may be 50 to 130 μm, or 60 to 100 μm.

Therefore, the coating process of the hard coating composition may be performed once or twice or more so that the hard coating layer satisfies the above-described thickness after curing.

Further, after the hard coating composition is applied, a curing process may be performed, and the curing may be performed by thermal curing or photocuring according to a conventional method.

The heat treatment or light irradiation conditions for the thermal curing and photocuring may be appropriately determined by controlling a wavelength region and an amount of light, or a temperature of the heat treatment depending on the type of the initiator.

The optical laminate according to an embodiment of the present disclosure prepared by the above-described method has high surface hardness, excellent mechanical properties, that is, scratch resistance and abrasion resistance, while having flexibility and improved resistance to cracks caused by mechanical stress. Specifically, the hard coating layer may have a high pencil hardness of 5H or more, more specifically 7H or more. In addition, the hard coating layer may have a minimum diameter at which cracks do not occur of 2 to 5 ϕ, more specifically 2.5 to 4 ϕ, in the measurement of outer bending resistance according to JIS K5600-5-1.

In addition, a thickness of the optical laminate may be 50 to 250 μm, 60 to 240 μm, 70 to 230 μm, 80 to 220 μm, or 100 to 200 μm.

According to another embodiment of the present disclosure, a flexible display apparatus including the optical laminate is provided.

The flexible display apparatus may include a touch panel of a curved, bendable, flexible, rollable, or foldable-shaped mobile communication terminal, smartphone, or tablet PC, a wearable device, and various displays. Examples of the wearable device include an accessory type (e.g., a watch, ring, bracelet, anklet, necklace, glasses, contact lens, or head-mounted-device (HMD)), a fabric or garment-integrated type (e.g., an electronic garment), a body attaching type (e.g., a skin pad or tattoo), or a bioimplant type (e.g., an implantable circuit).

The flexible display apparatus may be, for example, a liquid crystal display (LCD) device, a light emitting diode (LED) display device, an organic light emitting diode (OLED) display device, a micro electro mechanical system (MEMS) display device, or a rollable or foldable display device.

For example, the organic light emitting diode (OLED) display device may have a cover window of the flexible organic light emitting diode display device at an outer part in a direction in which light or a screen is emitted. And a cathode for providing electrons, an electron transport layer, an emission layer, a hole transport layer, and an anode for providing holes may be sequentially formed. In addition, the organic light emitting diode (OLED) display may further include a hole injection layer (HIL) and an electron injection layer (EIL).

In order for the organic light emitting diode (OLED) display to function and act as a flexible display, the electrodes of the cathode and the anode and each component may use an elastic material.

Another example of the flexible display device may be a rollable display or a foldable display.

The rollable display device may have various structures depending on application fields and specific forms, and may have a structure including a cover window, a touch panel, a polarizing plate, a barrier film, a light emitting device (OLED element, etc.), a transparent substrate, and the like.

ADVANTAGEOUS EFFECTS

The optical laminate according to the present disclosure may have high surface hardness, excellent mechanical properties, that is, scratch resistance and abrasion resistance, while having flexibility and improved resistance to cracks caused by mechanical stress. Thus, the optical laminate can be particularly usefully applied to a flexible or foldable display device.

DETAILED DESCRIPTION OF THE EMBODIMENTS

The present invention will be described in more detail in the following examples. However, these examples are only to illustrate the invention, and the scope of the invention is not limited thereto.

Each compound used in the following preparation examples is as follows:

(a1) The polysiloxane: The polysiloxane prepared in the following Synthesis Example 1 was used.

<Synthesis Example 1>

3-glycidoxypropyltrimethoxysilane (GPTMS, manufactured by Shinetsu) as a silane monomer, water (wherein, GPTMS:water=1 mol:3 mol) and toluene were added to a 1000 mL 3-neck flask, and stirred. A base catalyst (TMAH) was added to the resulting mixed solution in an amount of 1 part by weight based on 100 parts by weight of the silane monomer and reacted at 100° C. to obtain a polysiloxane (Mw: 2700 g/mol, Mn: 2100 g/mol, molecular weight distribution (Mw/Mn): 1.29, epoxy equivalent weight: 5.9 g/eq) containing 100 mol % of glycidoxypropyl modified silicone (GP).

(In Chemical Formula 1 above, $R^1$ is a glycidyl group (each R' is a hydrogen atom and R" is a methylene group in Chemical Formula 2), a=1, b=0, and c=0.) (a2) The polysiloxane: The polysiloxane prepared in the following Synthesis Example 2 was used.

<Synthesis Example 2>

250 g of 3-glycidoxypropyltrimethoxysilane (GPTMS, manufactured by Shinetsu) and 140 g of methyltrimethoxysilane (MTMS, manufactured by Shinetsu) as a silane monomer, water (wherein GPTMS:MTMS:water=1 mol:3 mol:0.97 mol) and 200 g of toluene were added to a 1000 mL 3-neck flask, and stirred. A base catalyst (TMAH) was added to the resulting mixed solution in an amount of 1 part by weight based on 100 parts by weight of the silane monomer and reacted at 100° C. to obtain a polysiloxane (Mw: 2300 g/mol, Mn: 1920 g/mol, molecular weight distribution (Mw/Mn): 1.29, epoxy equivalent weight: 2.95 g/eq) containing 62 mol % of glycidoxypropyl modified silicone (GP).

  (1)

(In Chemical Formula above, $R^1$ is a glycidyl group (each R' is a hydrogen atom and R" is a methylene group in Chemical Formula 2), R is a hydrogen atom, a=0.62, b=0.37, and c=0.01.)

(a3) The polysiloxane: The polysiloxane prepared in the following Synthesis Example 3 was used.

<Synthesis Example 3>

350 g of 3-glycidoxypropyltrimethoxysilane (GPTMS, manufactured by Shinetsu) and 61 g of methyltrimethoxysilane (MTMS, manufactured by Shinetsu) as a silane monomer, water (wherein, GPTMS:MTMS:water=1 mol:0.3 mol:0.3 mol) and 200 g of toluene were added to a 1000 mL 3-neck flask, and stirred. A base catalyst (TMAH) was added to the resulting mixed solution in an amount of 1 part by weight based on 100 parts by weight of the silane monomer and reacted at 100° C. to obtain a polysiloxane (Mw: 3200 g/mol, Mn: 2450 g/mol, molecular weight distribution (Mw/Mn): 1.30, epoxy equivalent weight: 4.54 g/eq) containing 76 mol % of glycidoxypropyl modified silicone (GP).

  (1)

(In Chemical Formula above, $R^1$ is a glycidyl group (each R' is a hydrogen atom and R" is a methylene group in Chemical Formula 2), $R^2$ is a methyl group, R is a hydrogen atom, a=0.76, b=0.23, and c=0.01.)

(b) The reactive monomer: Bisphenol A diglycidyl ether (manufactured by Alfa) was used.

(c1) The elastomer: Polycaprolactone diol (Mn=1300 Da, manufactured by Sigma Aldrich) was used.

(c2) The elastomer: Polycarbonate diol (manufactured by Aldrich) was used.

<Examples 1 to 5 and Comparative Examples 1 to 8>

Each hard coating composition was prepared by mixing the following components as shown in Table 1 below. 3 parts by weight of an iodonium-based compound (Omnicat 250™, manufactured by BASF) as an initiator and 10 parts by weight of toluene as a solvent were used based on 100 parts by weight of the polysiloxane.

<Experimental Examples>

An optical laminate was prepared by using one of the hard coating compositions prepared in the above examples and comparative examples, and then evaluated by the following method. The results are shown in Table 2.

<Preparation of Optical Laminate>

One of the composition prepared in the above examples and comparative examples was applied onto one surface of a polyamideimide film supporting substrate layer of 15 cm×20 cm and a thickness of 50 μm, and irradiated with ultraviolet rays for 10 seconds using a UV lamp (irradiation amount: 600 mJ/cm²) to form a hard coating layer having a thickness of 100 μm on the supporting substrate layer.

<Evaluation of Physical Properties>

1) Pencil Hardness

After reciprocating a pencil five times under a load of 1.0 kg using a pencil hardness measuring device according to JIS K5400, the hardness when scratches were not observed was confirmed.

2) Dent (Pressure Marks)

After reciprocating a pencil five times under a load of 1.0 kg using a pencil hardness measuring device according to JIS K5400, it was confirmed whether or not pressure marks occurred in the path passed. The pencil hardness when pressure marks did not occur was defined as a dent value, which was measured immediately after the reciprocation.

If pressure marks did not occur: O.K.

If pressure marks occurred: N.G.

3) Scratch Resistance

After steel wool (#000) was mounted on a friction tester and reciprocated 1000 times under a load of 500 gf, the number of flaws was counted with the naked eye, and the scratch resistance was evaluated according to the following criteria.

If the number of flaws is 2 or less: O.K. (Excellent scratch resistance)

If the number of flaws is more than 2: N.G. (Poor scratch resistance)

4) Dynamic Inner Bending Resistance

The hard coating layer was inwardly folded to face inward with a diameter of 5 mm, and unfolded. This was repeated 200,000 times, and the inner bending resistance was evaluated according to the following criteria by confirming whether or not a crack occurred.

If a crack did not occur: O.K.

If a crack occurred: N.G.

5) Dynamic Outer Bending Resistance

The hard coating layer was outwardly folded with a diameter of 6 mm, that is, the supporting substrate layer on which the hard coating layer was not formed was inwardly folded, and unfolded. This was repeated 200,000 times, and

TABLE 1

| Content (weight %) | | Examples | | | | | | | Comparative Examples | | | | | |
|---|---|---|---|---|---|---|---|---|---|---|---|---|---|---|
| | | 1 | 2 | 3 | 4 | 5 | 6 | 7 | 1 | 2 | 3 | 4 | 5 | 6 |
| (a1) Polysiloxane | | 84 | 73 | 55 | — | — | 84 | 73 | 91 | 55 | 90 | — | — | — |
| (a2) Polysiloxane | | — | — | — | — | — | — | — | — | — | — | 87 | 73 | 53 |
| (a3) Polysiloxane | | — | — | — | 74 | 52 | — | — | — | — | — | — | — | — |
| Reactive monomer | | 8 | 7 | 7 | 4 | 7 | 8 | 7 | 9 | — | 6 | 8 | 7 | 7 |
| Elastomer | (c1) Polycaprolactone diol | 8 | 20 | 38 | 22 | 41 | — | 20 | — | 45 | 4 | 4 | 20 | 40 |
| | (c2) Polycarbonate diol | — | — | — | — | — | 8 | — | — | — | — | — | — | — | the outer bending resistance was evaluated according to the following criteria by confirming whether or not a crack occurred.

If a crack did not occur: O.K.
If a crack occurred: N.G.
Outer bending resistance (Mandrel bend test)
6) Inner/Outer Bending Resistance (Mandrel Bend Test)

In order to evaluate flexibility of the optical laminate, each film of examples and comparative examples was mounted in mandrels of various diameters, and wound such that the hard coating layer faced inward according to JIS K5600-5-1. The occurrence of cracks and a minimum diameter at which cracks did not occur were measured to evaluate the inner bending resistance.

The outer bending resistance was evaluated in the same manner as above, except that the hard coating layer of the optical laminate was wound so as to face outward.

TABLE 2

|  | Pencil Hardness | Dent | Scratch resistance | Dynamic inner bending resistance | Dynamic outer bending resistance | Inner bending resistance (Mandrel) | Outer bending resistance (Mandrel) |
|---|---|---|---|---|---|---|---|
| Ex. 1 | 8 H | 8 H | O.K. | O.K. | O.K. | 2Φ | 4Φ |
| Ex. 2 | 8 H | 8 H | O.K. | O.K. | O.K. | 2Φ | 3Φ |
| Ex. 3 | 7 H | 7 H | O.K. | O.K. | O.K. | 2Φ | 2.5Φ |
| Ex. 4 | 8 H | 6 H | O.K. | O.K. | O.K. | 2Φ | 3Φ |
| Ex. 5 | 6 H | 6 H | O.K. | O.K. | O.K. | 2Φ | 2.5Φ |
| Ex. 6 | 8 H | 8 H | O.K. | O.K. | O.K. | 2Φ | 4Φ |
| Ex. 7 | 8 H | 8 H | O.K. | O.K. | O.K. | 2Φ | 3Φ |
| Comp. Ex. 1 | 8 H | 8 H | O.K. | O.K. | N.G. | 2Φ | 6Φ |
| Comp. Ex. 2 | 8 H | 5 H | O.K. | O.K. | O.K. | 2Φ | 3Φ |
| Comp. Ex. 3 | 4 H | 3 H | O.K. | O.K. | O.K. | 2Φ | 2.5Φ |
| Comp. Ex. 4 | 5 H | 5 H | O.K. | O.K. | N.G. | 2Φ | 6Φ |
| Comp. Ex. 5 | 4 H | 4 H | O.K. | O.K. | O.K. | 2Φ | 4Φ |
| Comp. Ex. 6 | 3 H | 3 H | O.K. | O.K. | N.G. | 2Φ | 4Φ |

Referring to Table 2 above, the optical laminates prepared using one of the hard coating compositions of Examples 1 to 5 exhibited flexibility and excellent resistance to cracks due to mechanical stress while having high surface hardness and excellent scratch resistance. In addition to having resistance to scratches, a dent due to a constant load did not occur. In Example 3, the hardness characteristics were relatively lower than those of the other examples by applying a relatively large amount of the elastomer, but both the hardness and the flexibility were improved as compared with comparative examples. In Example 4 in which the content based on 100 parts by weight of the polysiloxane was low in the hard coating composition, the dent property was relatively deteriorated, but both the hardness and the flexibility were improved as compared with the comparative examples.

On the other hand, the optical laminate prepared using the hard coating composition of Comparative Example 1 which does not contain an elastomer exhibited the same level of surface hardness and scratch resistance as those of the examples, but showed significantly deteriorated outer bending resistance due to a lack of flexibility. The optical laminate prepared using the hard coating composition of Comparative Example 2 which did not contain a reactive monomer exhibited the same level of surface hardness, scratch resistance and outer bending resistance as those of the examples. However, when pencil hardness was measured, it was confirmed that dent (pressure marks) occurred and the pressure marks were not restored well as compared with the examples.

Comparative Example 3, which did not satisfy the mixing ratio of the polysiloxane and the elastomer in the hard coating composition, had significantly lowered hardness characteristics as compared with Examples 1 to 3.

Comparative Examples 4 to 6, which did not satisfy the conditions of the polysiloxane, had significantly lowered hardness as compared with Examples 1 to 3, and the outer bending resistance was also deteriorated.

What is claimed is:

1. An optical laminate comprising a supporting substrate layer; and
   a hard coating layer located on at least one surface of the supporting substrate layer and comprising a cured product of a hard coating composition,
   wherein the hard coating composition comprises:
   a polysiloxane comprising 70 mol % or more of a structural unit containing a glycidyl group-containing functional group represented by the following Chemical Formula 1;
   an elastomer; and
   a reactive monomer containing at least one functional group capable of cross-linking with the polysiloxane, and
   the elastomer is contained in an amount of 5 to 80 parts by weight based on 100 parts by weight of the polysiloxane:

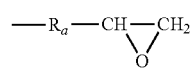

[Chemical Formula 1]

wherein, in Chemical Formula 1,
$R_a$ is selected from the group consisting of a substituted or unsubstituted C1 to C6 alkylene group, a substituted or unsubstituted C2 to C20 alkenylene group, a substituted or unsubstituted C2 to C20 alkynylene group, —$R_b$—CH=CH—COO—$R_c$—, —$R_d$—OCO—CH=CH—$R_e$—, —$R_f$O$R_g$—, —$R_h$COO$R_i$—, and —$R_j$OCO$R_k$—,
wherein $R_b$ to $R_k$ are each independently a single bond or a substituted or unsubstituted C1 to C6 alkylene group.

2. The optical laminate of claim 1,
wherein the structural unit containing the glycidyl group-containing functional group represented by Chemical Formula 1 is represented by the following Chemical Formula 2:

[Chemical Formula 2]

wherein, in Chemical Formula 2,
$R^1$ is the glycidyl group-containing functional group represented by Chemical Formula 1.

3. The optical laminate of claim 1,
wherein the polysiloxane further comprises at least one repeating unit selected from the group consisting of repeating units represented by the following Chemical Formulae 3 to 6:

$(R^2SiO_{3/2})$ [Chemical Formula 3]

$(R^3R^4SiO_{4/2})$ [Chemical Formula 4]

$(SiO_{4/2})$ [Chemical Formula 5]

$(O_{1/2}R^5)$ [Chemical Formula 6]

wherein, in Chemical Formulae 3 to 6,
$R^2$ to $R^5$ are each independently a hydrogen atom, an epoxy group, an acryl group, a methacryl group, a halogen group, an amino group, a mercapto group, an acetyl group, a formyl group, a carboxyl group, a nitro group, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C20 aryl group, a substituted or unsubstituted C7 to C20 arylalkyl group, or a substituted or unsubstituted C7 to C20 alkylaryl group.

4. The optical laminate of claim 1,
wherein the polysiloxane has an equivalent weight of the glycidyl group-containing functional group represented by Chemical Formula 1 of 3.0 to 6.3 g/eq.

5. The optical laminate of claim 1,
wherein the polysiloxane has a weight average molecular weight of 1000 to 50,000 g/mol, a number average molecular weight of 1000 to 10,000 g/mol, and a molecular weight distribution of 1.0 to 10.0.

6. The optical laminate of claim 1,
wherein the elastomer is at least one polyol selected from the group consisting of a polyether-based polyol, a polyester-based polyol, an aliphatic hydrocarbon-based polyol, and a polycarbonate-based polyol.

7. The optical laminate of claim 6,
wherein the polyester-based polyol is a polycaprolactone polyol represented by the following Chemical Formula 7:

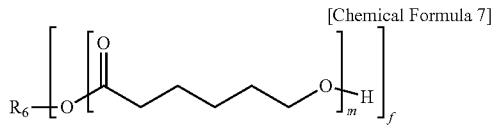

[Chemical Formula 7]

wherein, in Chemical Formula 7,
$R^6$ is a polyol-derived unit,
m is an integer of 1 or more, and
f is an integer of 2 or more.

8. The optical laminate of claim 1,
wherein the functional group capable of cross-linking with the polysiloxane is selected from the group consisting of an alicyclic epoxy group, a glycidoxy group, and an oxetane group.

9. The optical laminate of claim 1,
wherein the reactive monomer comprises at least one selected from the group consisting of bisphenol A diglycidyl ether, 4-vinylcyclohexene dioxide, cyclohexene vinyl monoxide, (3,4-epoxycyclohexyl)methyl 3,4-epoxycyclohexylcarboxylate, 3,4-epoxycyclohexylmethyl methacrylate, 3,4-epoxycyclohexanecarboxylate, 2-(3,4-epoxycyclohexyl)-1,3-dioxolane, bis(3,4-epoxycyclohexylmethyl)adipate, p-butyl phenol glycidyl ether, butyl glycidyl ether, cresyl glycidyl ether, allyl glycidyl ether, phenyl glycidyl ether, diglycidyl ether, butanediol diglycidyl ether, limonene dioxide, vinylcyclohexene dioxide, diethylene glycol diglycidyl ether, 3-methyloxetane, 2-methyloxetane, 3-oxetanol, 2-methyleneoxetane, 3-methyl-3-hydroxynnethyloxetane, 3-ethyl-3-hydroxymethyloxetane, 3,3-oxetanedimethanethiol, 2-ethylhexyloxetane, 4-(3-methyloxetane-3-yl)benzonitrile, N-(2,2-dimethylprophyl)-3-methyl-3-oxetanemethaneamine, N-(1,2-dimethylbutyl)-3-methyl-3-oxetanemethaneamine, xylylene bisoxetane, 3-ethyl-3[{(3-ethyloxetane-3-yl)methoxy}methyl]oxetane, (3-ethyloxetane-3-yl)methyl methacrylate, and 4-[(3-ethyloxetane-3-yl)methoxy]butane-1-ol.

10. The optical laminate of claim 1,
wherein the reactive monomer is contained in an amount of 5 to 20 parts by weight based on 100 parts by weight of the polysiloxane.

11. The optical laminate of claim 1,
further comprising at least one selected from the group consisting of an initiator, a solvent, an antioxidant, a surfactant, a yellowing inhibitor, an inorganic filler, a lubricant, a flow control agent, and an antifouling agent.

12. The optical laminate of claim 1,
wherein a minimum diameter at which cracks do not occur is 2 to 5 ϕ in the measurement of outer bending resistance according to JIS K5600-5-1.

13. The optical laminate of claim 1,
wherein a thickness thereof is 50 to 250 μm.

14. The optical laminate of claim 1,
wherein the supporting substrate layer comprises at least one resin selected from the group consisting of a polyester-based resin, a cellulose-based resin, a polycarbonate-based resin, an acryl-based resin, a styrene-based resin, a polyolefin-based resin, a polyimide-based resin, a polyamideimide-based resin, a polyethersulfone-based resin, and a sulfone-based resin.

15. A flexible display apparatus comprising the optical laminate of claim 1.

* * * * *